United States Patent [19]

Mullins

[11] Patent Number: 4,849,852
[45] Date of Patent: Jul. 18, 1989

[54] VARIABLE CAPACITANCE PUSH-BUTTON SWITCH

[75] Inventor: Barry Mullins, Claremont, Calif.

[73] Assignee: Alps Electric (U.S.A.), Inc., San Jose, Calif.

[21] Appl. No.: 251,605

[22] Filed: Sep. 30, 1988

[51] Int. Cl.⁴ .................. H01G 5/01; H01G 5/14
[52] U.S. Cl. .................................. 361/288; 200/5 A
[58] Field of Search ............... 200/5 A; 340/365 C; 361/288

[56] References Cited

U.S. PATENT DOCUMENTS

| | | | |
|---|---|---|---|
| 989,362 | 4/1911 | Hoeft | 200/5 A |
| 3,419,697 | 12/1968 | Gove | 361/288 X |
| 3,823,355 | 7/1974 | Batz | 361/288 |
| 3,965,399 | 6/1976 | Walker, Jr. et al. | 361/288 |
| 4,423,464 | 12/1983 | Tamura et al. | 361/288 |
| 4,446,342 | 5/1984 | Roberts | 200/5 A X |

*Primary Examiner*—Donald Griffin
*Attorney, Agent, or Firm*—Guy W. Shoup; Paul J. Winters; Brian D. Ogonowsky

[57] ABSTRACT

In a capacitive-type switch having two capacitive levels, a relatively thin blade of a desired dielectric material is interposed between two capacitive plates by downward actuation of a push-button switch so that the plates become separated by the blade. When the push button is released, the blade is removed from between the two capacitive plates and a high capacitance level is once again achieved.

7 Claims, 3 Drawing Sheets

VARIABLE CAPACITANCE PUSH-BUTTON SWITCH

FIELD OF THE INVENTION

The present invention relates to a push-button switch of a type operable to change its capacitance value upon actuation of a push button.

BACKGROUND OF THE INVENTION

In a keyboard or other data input device, variable capacitance push-button switches (hereinbelow termed "capacitance type switches") have come into wide use. In such switches, actuation of the push-button changes the capacitance of the switch. In a keyboard, for example, the changed capacitance of a depressed switch is detected and its row and column determined, causing to be generated a binary signal uniquely associated with the depression of that particular switch. Thus, the difference between the two capacitive levels of the switch needs to be made sufficiently great, and the capacitance level at each of the two switch positions must remain uniform throughout the life of the push-button switch and under a variety of pressures applied to the push-button switch by an operator's finger. Typically, capacitance type switches achieve two levels of capacitance by, upon actuation of the push-button, effectively separating or bringing together two conductive plates separated by a dielectric in order to change the distance between the plates and, consequently, the capacitance between the plates.

Capacitance is calculated using the equation:

$$C = AK\epsilon_0/t,$$

where
C is the capacitance
$\epsilon_0$ is the permittivity of empty space ($8.85 \times 10^{-2}$ coul$^2$/newton$^2$-m$^2$)
K is the dielectric constant
A is the plate area, and
t is the dielectric thickness.
As seen, by decreasing the dielectric thickness t between the plates, the capacitance is increased.

FIG. 1 is a sectional view of the essential portions of a known capacitance type switch, and principally illustrates the electrical construction of the switch. As shown in FIG. 1, a push rod 31 carries a movable electrode 36 having a dielectric film 35 thereover. The electrode 36 is movable relative to a pair of stationary electrodes 33 and 34 disposed on an insulating substrate 32. One of the stationary electrodes, such as electrode 33, serves as an input and the other electrode serves as the output of the switch. In FIG. 1, let $d_a$ and $d_f$ denote the thicknesses of the air gap and the dielectric film 35, respectively. When the push-button is pressed and dielectric film 35 approaches and contacts stationary electrodes 33 and 34, the air gap $d_a$ is reduced and the capacitance is thereby increased. Capacitance of the switch is determined by the series capacitance of the capacitor formed by stationary contact 33 and movable electrode 36 and the capacitor formed by stationary electrode 34 and movable electrode 36. Two patents which utilize this general means of providing two capacitance levels by actuation of a push-button switch are U.S. Pat. Nos. 3,965,399 to Walker, Jr. et al. and 4,423,464 to Tamura et al. These prior art patents concern themselves with increasing the reliability of the switch by obtaining a consistent dielectric thickness between the capacitive plates in both switch positions so that the two capacitance levels remain uniform throughout the life of the switch. As seen by inspection of FIG. 1, the dielectric thickness of, for example, dielectric 35 in FIG. 1 as well as the mechanical movement of the switch, controlling the air gap, must be precisely controlled to obtain uniform capacitances in both switch positions. These types of switches are therefore manufactured with high precision, resulting in a concomitant increased cost of manufacture. Further, the switch must be depressed to its full extent to achieve the full high capacitance level, adding to the complexity of the manufacture of the switch since the dielectric material must not be damaged by contact with the stationary electrodes.

SUMMARY OF THE INVENTION

My invention is a more reliable, yet relatively inexpensive, capacitive type push-button switch which comprises two resilient capacitive plates each comprising a dielectric substrate with a conductive layer thereon which are, in their normal position, resiliently pressed together with a force determined by their resiliency. A relatively thin blade of a desired dielectric material is interposed between the two capacitive plates by downward actuation of the switch so that the plates are separated by the blade. The penetration of the blade between the capacitive plates is determined by a stop in the structure of the switch which prevents the push-button to be pressed beyond a certain point. With the above-described switch design, the tolerances in the manufacture of the switch can be relaxed from those required for prior art capacitive type switches since the penetration of the blade between the capacitive plates may vary slightly without significantly changing the capacitance between the plates when the push-button switch is in its down position. This is because once the blade is even partially inserted between the plates, the plates have already been spaced apart in accordance with the thickness of the blade and any further penetration of the blade merely changes the proportion of blade dielectric to air dielectric between the plates. Further, the area of the plates can be increased if necessary without increasing the surface area of the switch since the plates are perpendicular to the surface of the switch, unlike prior art capacitive plates wherein the maximum area of the stationary plates may be limited by, for example, keyboard space. Further, the thickness of the blade, determining the distance between the plates, can easily be varied to form switches with a desired low capacitance level. Still further, the depth of the blade interposed between the capacitive plates can also be varied to increase the proportion of blade dielectric to air dielectric between the capacitive plates, hence, enabling an even greater ability to select a desired low level capacitance.

DETAILED DESCRIPTION

Figure 2:
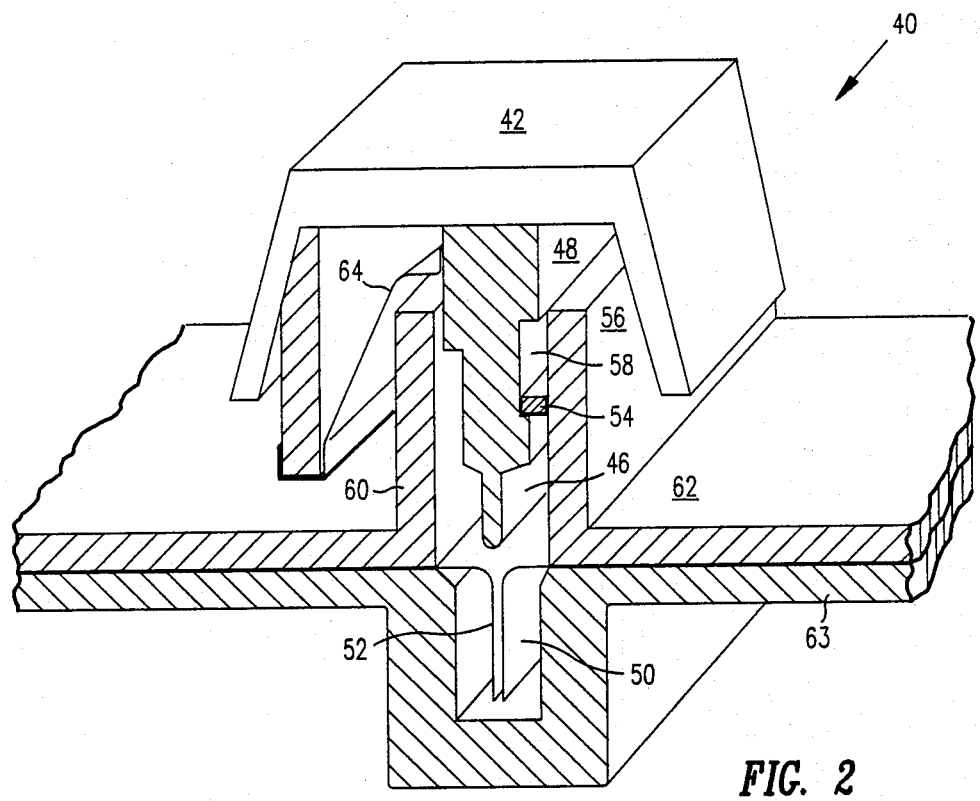
FIG. 2 shows a perspective view of the preferred embodiment of my capacitive type switch.

FIG. 2 shows the preferred embodiment of my inventive capacitive type switch 40 where key cap 42 is pressed downwardly, resisted by a spring (not shown), to interpose end blade portion 46, located at the end of plunger 48, between capacitive plates 50 and 52. Knob or stop 54, jutting out from plunger guide wall 56, coacts with plunger cavity 58 to limit the up and down movement of plunger 48. Opposite guide wall 56 is guide wall 60, which, in combination with guide wall 56, aligns plunger 48 and end blade portion 46 for insertion of blade portion 46 between capacitive plates 50 and 52. Top and bottom support members 62 and 63, respectively, provide the mechanical support for the structure.

In the embodiment of FIG. 2, spring 64 is a tactile spring clip which provides a satisfying abrupt change in resistance in the pressure resisting the operator's finger when key cap 42 is pressed, giving indication that the key has indeed been pressed. Spring 64 may be beneficially omitted if the change in mechanical resistance when blade portion 46 interposes between capacitive plates 50 and 52 is to provide the desired tactile signal. In such an embodiment, with spring 64 omitted, a first resistive force is sensed by the operator in pressing key cap 42 until blade portion 46 first contacts capacitive plates 50 and 52. At this point, the increased resistance in interposing blade portion 46 between capacitive plates 50 and 52 is sensed by the operator as the operator presses key cap 42 down further. After blade portion 46 has spread capacitive plates 50 and 52 apart, the resistance is decreased until further downward travel is mechanically stopped by stop 54. Hence, the changes in mechanical resistance provide the desired tactile signal to the operator. Thus, the tactile signal inherently occurs at the precise moment that the capacitive switch 40 begins to change its capacitance. The change in mechanical resistance, and hence the magnitude of the tactile signal, as blade portion 46 interposes between capacitive plates 50 and 52 can be adjusted by making the edge of blade portion 46 either more V-shaped, decreasing the change in mechanical resistance, or more blunt, increasing the change in mechanical resistance.

A spring for returning a pressed and released pushbutton back to its normal position will be described later with reference to FIG. 3.

The thickness and dielectric constant of blade portion 46, along with the area of the capacitive plates and the amount of insertion of end blade portion 46 between plates 50 and 52, determine the capacitance of the switch in its pressed or low capacitance position.

Figure 1:
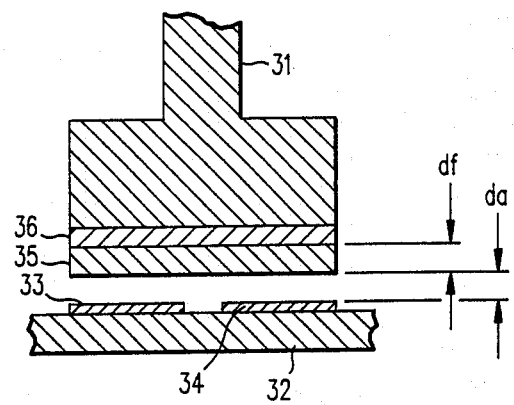
FIG. 1 shows a prior art capacitive type switch.

Capacitive plates 50 and 52 are, in one embodiment, comprised of a Mylar ® (or similar dielectric) substrate with a thin electrically conductive film deposited thereon. This film may be copper, deposited on the substrate by sputtering. In one embodiment, capacitive plates 50 and 52 also have a thin film of dielectric deposited on the conductive film so that as they resiliently contact each other, capacitive plates 50 and 52 are separated by the thickness of the dielectric film. Since the mechanical pressure of capacitive plate 50 against capacitive plate 52 is not affected by the downward pressure on the key cap but on the resiliency of the capacitive plates 50 and 52, there is no possibility of destroying the dielectric films on capacitive plates 50 and 52 due to an excessive amount of pressure on key cap 42—a problem inherent in the prior art of FIG. 1. The thickness of the dielectric film on capacitor plates 50 and 52 can be made as thin as desired to provide a desired high capacitance in this normally off push-button position. If desired, the deposition of the dielectric film may be omitted and the dielectric substrate may provide the desired separation of the electrically conductive films.

In a practical embodiment of capacitive switch 40, the Mylar ® substrate is between 2 to 4 mils thick; the conductive film is between 5–10 microns thick; the dielectric film is approximately 1 mil thick; the dimension of each of capacitive plates 50 and 52 is approximately 0.2 in. by 0.5 in.; and blade portion 46 is approximately 0.03 in. thick and interposes between capacitive plates 50 and 52 a maximum of between 0.08–0.2 in. with a total travel of approximately 0.140 in.

In the preferred embodiment, capacitive plates 50 and 52 are held in position by sandwiching the ends of capacitive plates 50 and 52 between top support member 62 and bottom support member 63.

In an example of an application of capacitive switch 40, capacitive plates 50 and 52 are coupled in series with other capacitive plates, so as to be equivalent to a capacitor in series with a plurality of other capacitors, wherein the total series capacitance is coupled to a capacitance detection means. The series capacitances are arranged to form rows and columns so that, given an adequate sensitivity of the capacitance detection means, each switch when pressed would produce a characteristic change in the total series capacitance of both a particular row and column, identifying which capacitive switch has been actuated.

Figure 3:
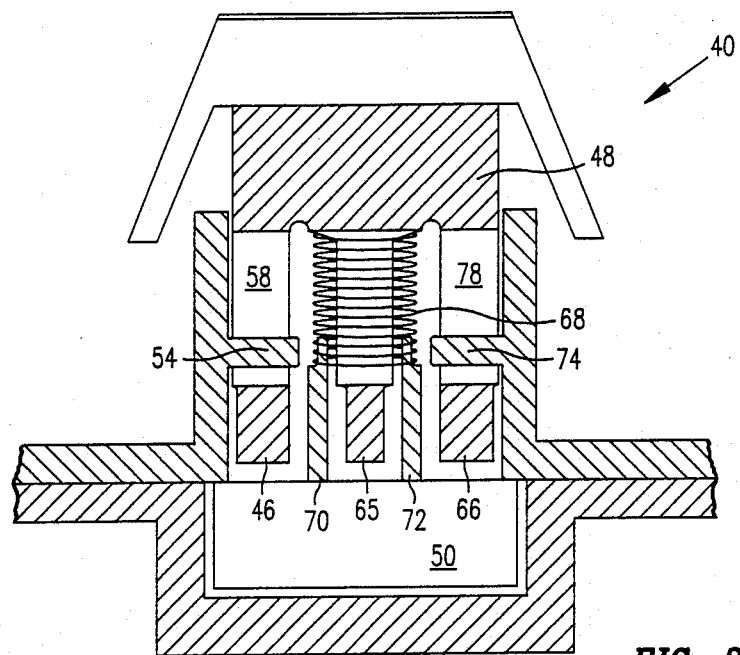
FIG. 3 shows a side view of the preferred embodiment of my capacitive type switch.

FIG. 3 shows a side view of capacitive switch 40. In FIG. 3, capacitive plate 50 is shown along with end blade portion 46, center blade portion 65, and end blade portion 66. As seen from FIG. 3, the three blade portions, all commonly fixed to plunger 48, are positioned to interpose between capacitive plates 50 and 52 (capacitive plate 52 not shown). The purpose of the three blade portions is to provide a centered location for return spring 68 through which center blade portion 65 travels. Return spring 68 remains positioned between fixed supports 70 and 72 and plunger 48 so that return spring 68 urges blade portions 46, 65, and 66 out of between capacitive plates 50 and 52 and into the high capacitance position. Stops 54 and 74 are clearly shown which interact with cavities 58 and 78 in end blade portions 46 and 66, respectively.

Figure 4:
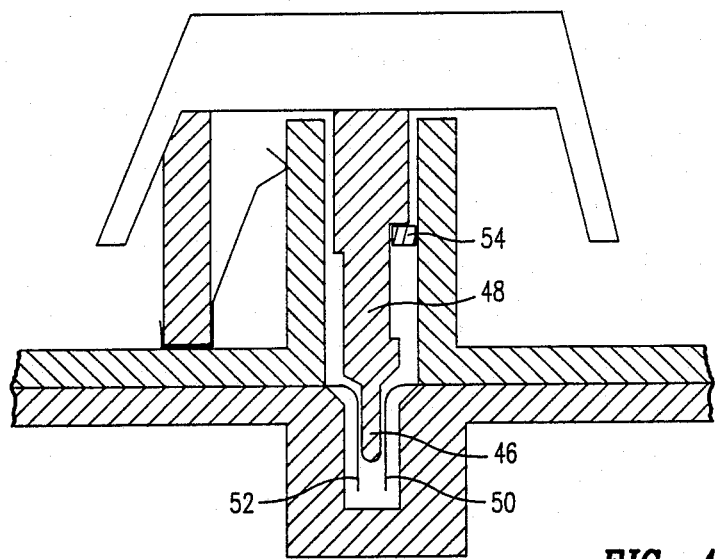
FIG. 4 shows a front view of the preferred embodiment of my capacitive type switch in its depressed position.

FIG. 4 shows a front view of capacitive switch 40 in its depressed position where end blade portion 46 is shown interposed between capacitive plates 50 and 52. As seen, stop 54 prevents plunger 48 from further downward movement. The capacitance between capacitive plates 50 and 52 is determined by the capacitance between capacitive plates 50 and 52 across the blade dielectric material in parallel with the capacitance between plates 50 and 52 across the air gap. As seen, capacitance in this depressed position can be modified by either elongation of the blade between the capacitive plates 50 and 52, assuming the dielectric constant of end blade portion 46 differs from that of air, or varying the thickness of end blade portion 46. By both adjusting the thickness of the blade and the depth of the blade between the plates, a wide range of low level capacitances are easily obtainable.

Figure 5A:
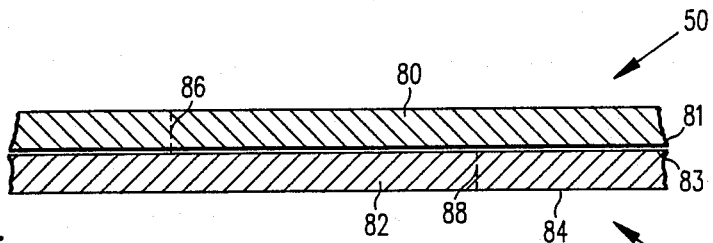
FIGS. 5a through 5d show the preferred method of manufacture of the capacitive plates used in my capacitive type switch.

The preferred manufacture of capacitive plates 50 and 52 in their arrangement shown in FIGS. 2-4 is shown in FIGS. 5a-5e. FIG. 5a shows capacitive plates 50 and 52 with capacitive plate 50 comprising dielectric substrate 80 and conductive film 81 deposited thereon, and capacitive plate 52 comprising dielectric substrate 82 and conductive film 83 deposited thereon. In another embodiment, conductive film 81 may be deposited on the top of dielectric substrate 80 and a separate dielectric film may be deposited on the bottom of dielectric substrate 80 so that when capacitive plates 50 and 52 are in their resiliently opposing positions, they will be separated by the dielectric film. In this way, the separation of capacitive plates 50 and 52 may be made as small as desired without affecting the thickness and resiliency of the substrate. As the thickness of dielectric substrate 80 is reduced, a higher capacitance in the normally off position is achieved, enabling a larger difference between capacitances in the on and off switch positions. Deposited on the underside of capacitive plate 52 is a ground potential conductive layer 84 to decrease noise. However, grounded layer 84 is not required for acceptable operation of the capacitive switch and may be eliminated.

The structure of FIG. 5a is manufactured as two overlapping sheets using well known processes whereby dielectric substrate 80 of capacitive plate 50 has first deposited on it conductive film 81, and dielectric substrate 82 of capacitive plate 52 has deposited on one side conductive film 83 and deposited on its other side grounded layer 84. By using a thinner dielectric substrate 80, the capacitance of the switch in its high capacitance position will be made higher. Since dielectric substrates 80 and 82 must be thick enough to provide a desired amount of resiliency and mechanical strength, if a desired dielectric thickness between conductive films 81 and 83 is less than about 2 mils, conductive film 81 would have to be deposited on the top of dielectric substrate 80 and a thin dielectric film must then be deposited over the conductive film.

Next, as shown in FIG. 5a, cuts are made, or breakable perforations are made, in the flat sheets at points 86 and 88, and the two sheets are then placed flat together and fixed in position on, for example, a keyboard by, as shown in FIG. 2, top support 62 and bottom support 63.

Figure 5B:
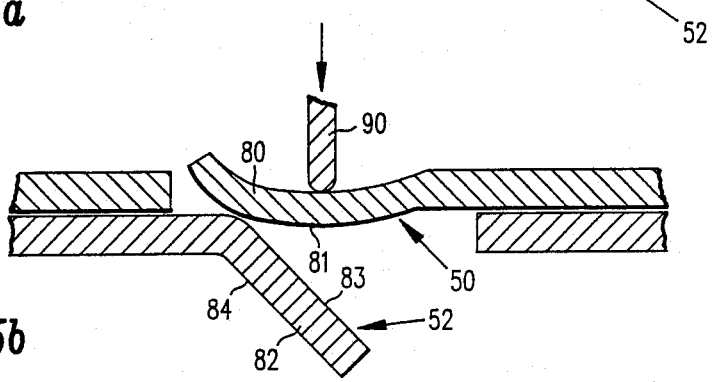

As shown in FIG. 5b, a separating tool 90 may be used to press down on a center position between points 86 and 88 to separate a portion of capacitive plate 50 from the upper remaining sheet and concurrently separate a portion of capacitive plate 52 from the lower remaining sheet.

Figure 5C:
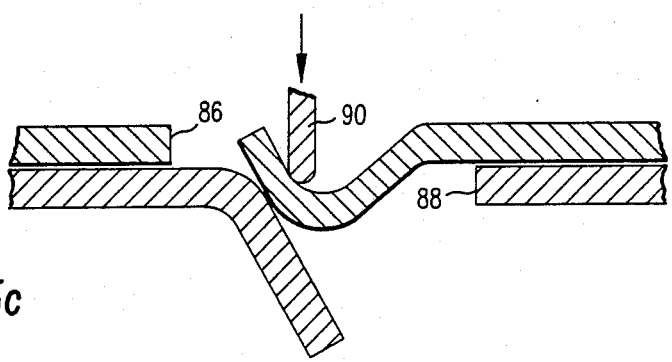
Figure 5D:
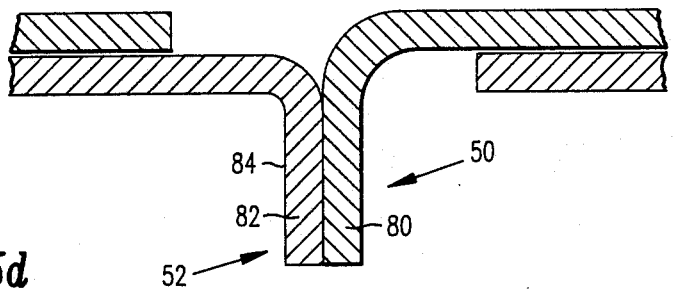

In FIG. 5c, separating tool 90 is shown continuing its downward movement until capacitive plates 50 and 52 are completely broken from their sheets and are facing each other perpendicular to the sheet, as shown in FIG. 5d. In FIG. 5d, capacitive plates 50 and 52 are resiliently pressed together by the resiliency of the capacitive plates 50 and 52.

Thus, a novel and improved capacitive type switch has been taught along with a preferred method of manufacture. My inventive switch is relatively simple to manufacture and overcomes many of the problems associated with prior art type capacitive switches. The concepts used in this invention may be modified in an obvious manner by one of ordinary skill in the art for various purposes while keeping with the spirit and scope of the invention, that being the insertion of a dielectric blade actuated by a push button to separate two capacitive plates which are separated by a dielectric when the blade is removed.

I claim:

1. A capacitive switch comprising:
   a first capacitive plate having a first dielectric layer thereon;
   a second capacitive opposing said first capacitive plate and separated from said first capacitive plate by said dielectric layer when said switch is in a first position;
   means for applying a resilient force to said first and second capacitive plates so that said first and second capacitive plates are resiliently pressed against each other, while separated by said first dielectric layer, when said switch is in said first position; and
   a blade means of a desired thickness and dielectric constant, which, when said switch is actuated to be in a second position, interposes between said first and second capacitive plates, causing a change of capacitance between said first and second capacitive plates.

2. The capacitive switch of claim 1 wherein said means for applying a resilient force is the natural resilience of said opposing first and second capacitive plates urging said opposing first and second capacitive plates toward each other.

3. The capacitive switch of claim 2 wherein each of said first and second capacitive plates comprise a dielectric substrate with a conductive layer deposited thereon, wherein said first dielectric layer is said dielectric substrate associated with said first capacitive plate.

4. The capacitive switch of claim 2 wherein each of said first and second capacitive plates comprise a dielectric substrate with a conductive layer deposited thereon, wherein said first dielectric layer is a dielectric film deposited on said conductive layer.

5. The capacitive switch of claim 2 wherein when said blade means interposes between said first and second capacitive plates, a tactile signal is conveyed to an operator solely by means of a change in mechanical resistance due to said blade means interposing between said first and second capacitive plates.

6. The capacitive switch of claim 1 wherein said second capacitive plate has a second dielectric layer thereon which opposes said first dielectric layer.

7. A method of causing a change in capacitance upon actuation of a push-button switch comprising:
   interposing a dielectric blade between two resiliently opposed capacitive plates, separated by a dielectric layer, upon depression of said push-button switch, causing said capacitive plates to be separated by at least the thickness of said dielectric blade, where upon release of said push button, said blade is removed from between said capacitive plates and said capacitive plates once again oppose each other through said dielectric layer by a resilient force.

* * * * *